(12) United States Patent
Sukegawa et al.

(10) Patent No.: US 10,199,063 B2
(45) Date of Patent: Feb. 5, 2019

(54) UNDERLAYER FOR PERPENDICULARLY MAGNETIZED FILM, PERPENDICULARLY MAGNETIZED FILM STRUCTURE, PERPENDICULAR MTJ ELEMENT, AND PERPENDICULAR MAGNETIC RECORDING MEDIUM USING THE SAME

(71) Applicant: NATIONAL INSTITUTE FOR MATERIALS SCIENCE, Ibaraki (JP)

(72) Inventors: Hiroaki Sukegawa, Ibaraki (JP); Zhenchao Wen, Ibaraki (JP); Seiji Mitani, Ibaraki (JP); Koichiro Inomata, Ibaraki (JP); Takao Furubayashi, Ibaraki (JP); Jason Paul Hadorn, Ibaraki (JP); Tadakatsu Ohkubo, Ibaraki (JP); Kazuhiro Hono, Ibaraki (JP); Jungwoo Koo, Ibaraki (JP)

(73) Assignee: NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 36 days.

(21) Appl. No.: 15/127,527

(22) PCT Filed: Mar. 19, 2015

(86) PCT No.: PCT/JP2015/058306
§ 371 (c)(1),
(2) Date: Sep. 20, 2016

(87) PCT Pub. No.: WO2015/141794
PCT Pub. Date: Sep. 24, 2015

(65) Prior Publication Data
US 2017/0140784 A1 May 18, 2017

(30) Foreign Application Priority Data
Mar. 20, 2014 (JP) .................................. 2014-058440

(51) Int. Cl.
*G11B 5/65* (2006.01)
*G11B 5/73* (2006.01)
(Continued)

(52) U.S. Cl.
CPC ............ *G11B 5/653* (2013.01); *G11B 5/3909* (2013.01); *G11B 5/65* (2013.01); *G11B 5/656* (2013.01);
(Continued)

(58) Field of Classification Search
None
See application file for complete search history.

(56) References Cited

U.S. PATENT DOCUMENTS 5,738,927 A * 4/1998 Nakamura ............. G11B 5/656
360/135
7,282,278 B1 10/2007 Nolan
(Continued)

FOREIGN PATENT DOCUMENTS

| JP | 2006-286105 | 10/2006 |
|---|---|---|
| JP | 2010-232499 | 10/2010 |
| JP | 2012-238631 | 12/2012 |

OTHER PUBLICATIONS

International Search Report dated Jun. 9, 2015 in International Application No. PCT/JP2015/058306.
(Continued)

*Primary Examiner* — Kevin M Bernatz
(74) *Attorney, Agent, or Firm* — Wenderoth, Lind & Ponack, L.L.P.

(57) ABSTRACT

Disclosed is a perpendicularly magnetized film structure that uses a highly heat resistant underlayer film on which a cubic or tetragonal perpendicularly magnetized film can grow with high quality, the structure comprising any one substrate (5) of a cubic single crystal substrate having a (001) plane, or a
(Continued)

substrate having a cubic oriented film that grows to have the (001) plane; an underlayer (6) formed on the substrate (5) from a thin film of a metal having an hcp structure, such as Ru or Re, in which the [0001] direction of the thin metal film forms an angle in the range of 42° to 54° with respect to the <001> direction or the (001) orientation of the substrate (5); and a perpendicularly magnetized layer (7) located on the metal underlayer (6) and formed from a cubic material selected from the group consisting of a Co-based Heusler alloy, a cobalt-iron (CoFe) alloy having a bcc structure, and the like, as a constituent material, and grown to have the (001) plane.

8 Claims, 14 Drawing Sheets

(51) Int. Cl.

| | | |
|---|---|---|
| G11B 5/84 | (2006.01) | |
| G11B 5/851 | (2006.01) | |
| G11B 5/66 | (2006.01) | |
| H01F 10/30 | (2006.01) | |
| H01F 10/32 | (2006.01) | |
| G11B 5/39 | (2006.01) | |
| G11C 11/16 | (2006.01) | |
| H01F 10/12 | (2006.01) | |

(52) U.S. Cl.
CPC .............. *G11B 5/66* (2013.01); *G11B 5/7315* (2013.01); *G11B 5/7325* (2013.01); *G11B 5/8404* (2013.01); *G11B 5/851* (2013.01); *G11C 11/161* (2013.01); *H01F 10/30* (2013.01); *H01F 10/3286* (2013.01); *H01F 10/123* (2013.01)

(56) References Cited

U.S. PATENT DOCUMENTS

| | | | | |
|---|---|---|---|---|
| 7,566,507 | B2* | 7/2009 | Abarra | G11B 5/66 428/828 |
| 8,609,263 | B1 | 12/2013 | Chernyshov et al. | |
| 8,866,367 | B2* | 10/2014 | Fox | C30B 23/02 310/357 |
| 9,734,857 | B2* | 8/2017 | Kim | G11B 5/82 |
| 2006/0222896 | A1 | 10/2006 | Inomata et al. | |
| 2012/0088125 | A1 | 4/2012 | Nishiyama et al. | |
| 2012/0287696 | A1 | 11/2012 | Ohmori et al. | |

OTHER PUBLICATIONS

Yoshihisa Nakamura (editor), "Advanced Technologies of Perpendicular Magnetic Recording", CMC Publishing Co., Ltd. pp. 213-219 (Aug. 2007).

A. Perurnal, Y.K. Takahashi, and K. Hono, "$L1_0$ FePt-C Nanogranular Perpendicular Anisotropy Films with Narrow Size Distribution," Applied Physics Express, vol. 1, p. 101301 (2008).

S. Ikeda et al., "A perpendicular-anisotropy CoFeB-MgO magnetic tunnel junction", Nature Mater., vol. 9, pp. 721-724 (2010).

Z.C. Wen, H. Sukegawa, S. Mitani, and K. Inomata, "Perpendicular magnetization of $Co_2FeAl$ full-Heusler alloy films induced by MgO interface", Applied Physics Letters, vol. 98, p. 242507 (2011).

* cited by examiner

Fig. 16
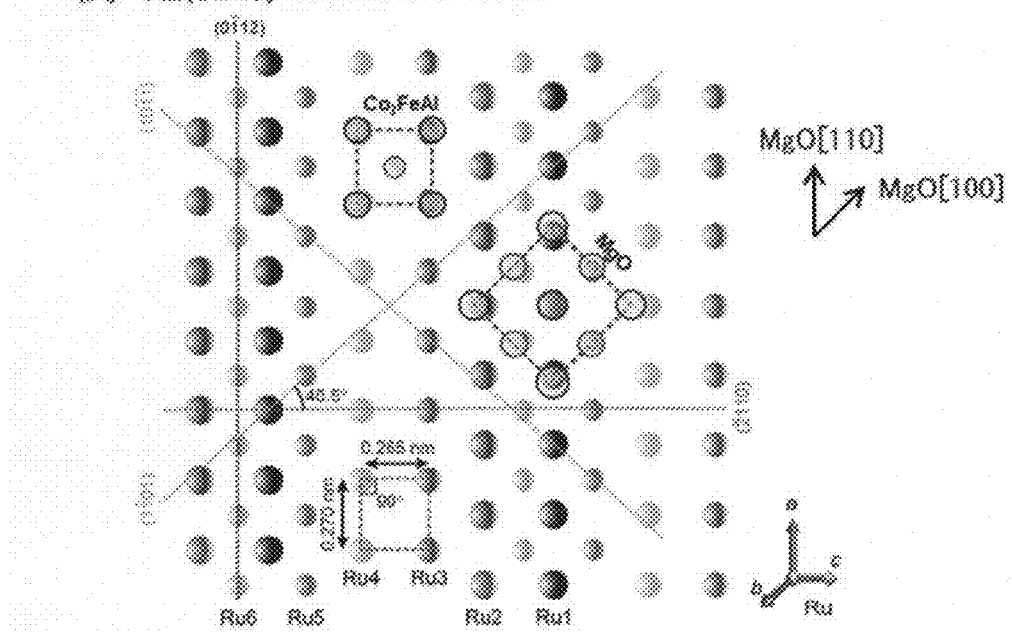
(A) Ru(02$\bar{2}$3) BIRD'S-EYE VIEW
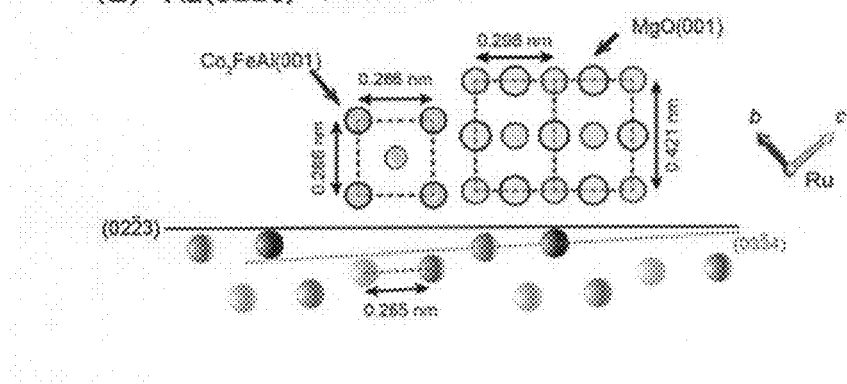
(B) Ru(02$\bar{2}$3) SIDE VIEW

UNDERLAYER FOR PERPENDICULARLY MAGNETIZED FILM, PERPENDICULARLY MAGNETIZED FILM STRUCTURE, PERPENDICULAR MTJ ELEMENT, AND PERPENDICULAR MAGNETIC RECORDING MEDIUM USING THE SAME

TECHNICAL FIELD

The present invention relates to an underlayer for a perpendicularly magnetized film using a non-magnetic material having a hexagonal close packed structure, which serves as an underlayer intended for growing of a ferromagnetic thin film, and to a perpendicularly magnetized film structure. Furthermore, the present invention relates to a perpendicular MTJ element and a perpendicular magnetic recording medium, which use the relevant perpendicularly magnetized film structure.

BACKGROUND ART

Along with the advances in high density recording and capacity increase with respect to magnetic storages or memories, which are represented by magnetic disk devices (hard disks) and magnetoresistive random access magnetic memories (MRAM) that use magnetic materials, utilization of perpendicularly magnetized films that are magnetized in the direction perpendicular to the film plane is effective. For the increase in the recording density induced by miniaturization of the recording media for hard disks using this perpendicularly magnetized film or magnetic tunnel junction elements (MTJ elements) that constitute the recording bits of MRAM, it is necessary to increase the magnetic anisotropy energy density Ku through quality improvement of the perpendicularly magnetized film. Also, in order to obtain a perpendicularly magnetized film with superior quality, the presence of an underlayer that takes an important role in the control of the crystal orientation or the crystal grain size, reduction of stacking faults, and securing of flatness, is extremely important.

Non-Patent Literature 1 discloses that in perpendicular magnetized recording media of Co-based alloys such as a cobalt-platinum-chromium (Co—Pt—Cr) alloy or the like, a Ru underlayer having a hexagonal close packed (hcp) structure is used, which has the same crystal structure as these alloys do. Furthermore, in regard to a $L1_0$ type iron-platinum (FePt) alloy that is expected to be applied to recording media or MTJ elements of the future because a very high Ku may be obtained, Non-Patent Literature 2 discloses magnesium oxide (MgO) having a sodium chloride structure (NaCl structure) as an effective material for an underlayer for the alloy, while Patent Literature 1 discloses magnesium-titanium oxide ($MgTiO_x$).

Furthermore, in a perpendicularly magnetized film for exclusive use in a MTJ element, perpendicular magnetization can be realized even for soft magnetic materials such as cobalt-iron-boron (CoFeB) or iron (Fe), which do not exhibit perpendicular magnetization in a bulk state, when the interface effect of an ultrathin film structure is utilized. Therefore, it has been suggested that the perpendicularly magnetized film can be used as a recording layer (interface-induced perpendicularly magnetized layer). In this case, according to Non-Patent Literatures 3 and 4, a microcrystalline material or a body-centered cubic (bcc) structure-based material, such as tantalum (Ta) or chromium (Cr), is utilized as an underlayer.

However, the above conventional $L1_0$ type alloys and MgO underlayers have lattice mismatch at a proportion of close to 10%, and a flat film form having high crystallinity and high degree of order cannot be realized. Furthermore, the underlayers for conventional interface-induced perpendicularly magnetized layers have poor heat resistance, and have a problem that the heating treatment necessary for securing the tunnel magnetoresistance (TMR) ratio of a MTJ element cannot be implemented. Also, some of ferromagnetic materials are subjected to the influence of distortion by the underlayer, and therefore, it is made impossible to extract sufficient characteristics. Therefore, it has been hitherto difficult to enhance the product quality of magnetic recording media or MTJ elements, which use these perpendicularly magnetized films.

CITATION LIST

Patent Literature

Patent Literature 1: WO 2014/004398 A1

NON-PATENT LITERATURES

Non-Patent Literature 1: Yoshihisa Nakamura (editor), "Advanced Technologies of Perpendicular Magnetic Recording", CMC Publishing Co., Ltd. (2007/08)

Non-Patent Literature 2: A. Perumal, Y. K. Takahashi, and K. Hono, "$L1_0$ FePt-C Nanogranular Perpendicular Anisotropy Films with Narrow Size Distribution," Applied Physics Express, vol. 1, p. 101301 (2008).

Non-Patent Literature 3: S. Ikeda et al., "A perpendicular-anisotropy CoFeB—MgO magnetic tunnel junction", Nature Mater., vol. 9, pp. 721-724 (2010).

Non-Patent Literature 4: Z. C. Wen, H. Sukegawa, S. Mitani, and K. Inomata, "Perpendicular magnetization of $Co_2FeAl$ full-Heusler alloy films induced by MgO interface", Applied Physics Letters, vol. 98, p. 242507 (2011).

SUMMARY OF INVENTION

Technical Problem

The present invention solved the conventional problems in view of such circumstances, and it is an object of the present invention to provide a perpendicularly magnetized film structure that uses a highly heat resistant underlayer film on which a cubic or tetragonal perpendicularly magnetized film can grow with high quality.

Furthermore, it is another object of the present invention to provide a perpendicularly magnetized film and a perpendicular MTJ element, both of which are formed using the relevant perpendicularly magnetized film structure.

Solution to Problem

The inventors of the present invention found, in the course of conducting a study on perpendicularly magnetized MTJ elements, a Ru underlayer having a high crystal orientation index and having an hcp structure, which is obtained on an MgO layer by controlling the growth conditions, and found that a cubic cobalt-iron-aluminum ($Co_2FeAl$) alloy thin film grown on the Ru underlayer is formed with the (001) orientation and becomes a perpendicularly magnetized film. Furthermore, the present inventors also found that this perpendicularly magnetized film has perpendicular magnetic anisotropy that is significantly higher compared to the case in which the perpendicularly magnetized film is produced on a Cr layer, which is a general underlayer material, and that in a case in which this perpendicularly magnetized film is used as a constituent element for a MTJ element, an increase in the TMR ratio is also obtained. Furthermore, the inventors also found that through the highness of the melting point of Ru, and the difference in the crystal system between Ru and the alloy thin film, the perpendicularly magnetized film has high heat resistance. The present inventors also found that in regard to rhenium (Re) that is a noble metal similarly to Ru and has an hcp structure, rhenium grows with a high crystal orientation index that is equivalent to that of Ru on an MgO layer, and can be utilized as an underlayer for a cubic ferromagnetic substance. This implies that this is widely effective not only for Ru, but also for any material having an hcp structure.

The present invention was completed based on these new findings.

That is, an underlayer for a perpendicularly magnetized film of the present invention includes a metal having an hcp structure, wherein a [0001] direction of the underlayer forms an angle in the range of 42° to 54° with respect to a cubic single crystal substrate having a (001) plane or a cubic oriented film grown to have a (001) plane.

Here, the metal having an hcp structure may be of various kinds, and examples of preferred metals include noble metals such as Ru and Re.

For example, in a case in which the metal is Ru, this is Ru having the hcp structure illustrated in FIG. 1 to FIG. 4. The Ru [0001] direction forms an angle in the range of 42° to 54° with respect to a cubic single crystal substrate having the (001) plane or a cubic oriented film that grows in the (001) plane. In a case in which the Ru [0001] direction is less than 42°, the crystal orientation becomes lower than the (01-12) plane of Ru, and in a case in which the Ru [0001] direction is more than 54°, the crystal orientation becomes higher than the (03-34) plane of Ru. Accordingly, the tetragonal lattice of Ru does not appear, and therefore, Ru does not function as an underlayer for cubic and tetragonal perpendicularly magnetized films.

In the underlayer for a perpendicularly magnetized film of the present invention, at least one of the cubic single crystal substrate or the cubic oriented film is preferably formed from magnesium oxide or magnesium-titanium oxide.

Furthermore, in regard to the underlayer for a perpendicularly magnetized film of the present invention, the underlayer preferably has a structure having any one of a (02-23) plane, a (03-35) plane and a (03-35) plane.

The perpendicularly magnetized film structure of the present invention includes, for example, as illustrated in FIG. 5, any one (5) of a cubic single crystal substrate having a (001) plane or a substrate having a cubic oriented film grown to have a (001) plane; an underlayer (6) formed on the substrate 5, the underlayer including a metal thin film having an hcp structure, in which the [0001] direction forms an angle in the range of 42° to 54° with respect to the <001> direction or the (001) plane of the substrate 5; and a perpendicularly magnetized layer (7) located on the underlayer 6, the perpendicularly magnetized layer being formed from a cubic material, as a constituent material, which is selected from the group consisting of a Co-based Heusler alloy, a cobalt-iron (CoFe) alloy having a bcc structure, an $L1_0$-based alloy XY (X=Fe or Co, and Y=Pt or Pd), a $DO_{22}$ type or an $L1_0$ type manganese alloy, for example, a manganese-gallium (Mn—Ga) alloy or a manganese-germanium (Mn—Ge) alloy, and grows to have the (001) plane.

The perpendicularly magnetized film structure of the present invention preferably includes a non-magnetic layer (8) located on the perpendicularly magnetized layer.

The perpendicular MTJ element film of the present invention includes, for example, as illustrated in FIG. 6, any one (10) of a cubic single crystal substrate having a (001) plane or a substrate having a cubic oriented film grown in a (001) orientation; an underlayer (11) formed on the substrate 10, the underlayer including a metal thin film having an hcp structure, in which a [0001] direction forms an angle in the range of 42° to 54° with respect to the <001> direction or the (001) plane of the substrate 10; a first perpendicularly magnetized layer (12) located on the underlayer 11, the first perpendicularly magnetized layer being formed from a cubic material, as a constituent material, which is selected from the group consisting of a Co-based Heusler alloy, a cobalt-iron (CoFe) alloy having a bcc structure, an $L1_0$-based alloy XY (X=Fe or Co, and Y=Pt or Pd), a $DO_{22}$ type or an $L1_0$ type manganese alloy, for example, a manganese-gallium (Mn—Ga) alloy and a manganese-germanium (Mn—Ge) alloy, and is grown in the (001) orientation; a tunnel barrier layer (13) located on the first perpendicularly magnetized layer 12, the tunnel barrier layer containing a constituent material which is selected from the group consisting of MgO, spinel ($MgAl_2O_4$), and aluminum oxide ($Al_2O_3$), and grows in the (001) orientation and a direction equivalent thereto; and a second perpendicularly magnetized layer (14) located on the tunnel barrier layer 13, the second perpendicularly magnetized layer being formed from a cubic material, as a constituent material, which is selected from the group consisting of a Co-based Heusler alloy, a cobalt-iron (CoFe) alloy having a bcc structure, an $L1_0$-based alloy XY (X=Fe or Co, and Y=Pt or Pd), a $DO_{22}$ type or an $L1_0$ type manganese alloy, for example, a manganese-gallium (Mn—Ga) alloy and a manganese-germanium (Mn—Ge) alloy, and grows in the (001) orientation.

Preferably, the perpendicular MTJ element film may have an upper electrode (15), which is preferably located on the second perpendicularly magnetized layer 14 and contains Ta and at least one of the above-described metals as a constituent material.

The perpendicular magnetic recording medium of the present invention has at least one of the underlayer for a perpendicularly magnetized film, the perpendicularly magnetized film structure, and the perpendicular MTJ element film.

The method for producing a perpendicularly magnetized film structure of the present invention includes a step of providing a cubic single crystal substrate 5 having a (001) plane; a step of forming a metal thin film having a hcp structure on the substrate 5; a step of forming a metal underlayer 6 by subjecting the metal thin film to a post-annealing treatment in a vacuum at 200° C. to 600° C.; and a step of forming a perpendicularly magnetized layer 7 on the metal underlayer 6, using a cubic material that is selected from the group consisting of a Co-based Heusler alloy, a cobalt-iron (CoFe) alloy having a bcc structure, an $L1_0$-based alloy XY (X=Fe or Co, and Y=Pt or Pd), a $DO_{22}$ type or an $L1_0$ type manganese alloy, for example, a manganese-gallium (Mn—Ga) alloy or a manganese-germanium (Mn—Ge) alloy, and grows to have the (001) plane.

The method for producing a perpendicular MTJ element film of the present invention includes a step of providing a cubic single crystal substrate 10 having a (001) plane; a step of forming the metal thin film on the substrate 10; a step of forming a metal underlayer 11 by subjecting the metal thin film to a post-heating treatment in a vacuum at 200° C. to 600° C.; a step of forming a first perpendicularly magnetized layer 12 on the metal underlayer 11, using a cubic material which is selected from the group consisting of a Co-based Heusler alloy, a cobalt-iron (CoFe) alloy having a bcc structure, an $L1_0$-based alloy XY (X=Fe or Co, and Y=Pt or Pd), a $DO_{22}$ type or an $L1_0$ type manganese alloy, for example, a manganese-gallium (Mn—Ga) alloy or a manganese-germanium (Mn—Ge) alloy, and grows to have the (001) plane; a step of forming a tunnel barrier layer 13 on the first perpendicularly magnetized layer 12, the tunnel barrier layer containing a constituent material which is selected from the group consisting of MgO, spinel ($MgAl_2O_4$) and aluminum oxide ($Al_2O_3$), and grows in the (001) orientation and a direction equivalent thereto; and a step of forming a second perpendicularly magnetized layer 14 on the tunnel barrier layer 13, the second perpendicularly magnetized layer being formed from a cubic material, as a constituent material, which is selected from the group consisting of a Co-based Heusler alloy, a cobalt-iron (CoFe) alloy having a bcc structure, an $L1_0$-based alloy XY (X=Fe or Co, and Y=Pt or Pd), a $DO_{22}$ type or an $L1_0$ type manganese alloy, for example, a manganese-gallium (Mn—Ga) alloy or a manganese-germanium (Mn—Ge) alloy, and grows to have the (001) plane.

Preferably, the method for producing a perpendicular MTJ element film may have a step of forming an upper electrode 15, which is preferably located on the second perpendicularly magnetized layer 14 and contains Ta and at least one of the above-described metals as a constituent material.

Advantageous Effects of Invention

The fact that when a metal layer of ruthenium (Ru), rhenium (Re) or the like, which have planes with high crystal indices, is realized, an atomic arrangement close to a tetragonal arrangement is obtained despite having a hexagonal close-packed (hcp) structure, is utilized, and a ferromagnetic material belonging to the cubic system or the tetragonal system is enabled to grow in the (001) orientation. A perpendicularly magnetized film having high heating resistance can be realized, and also, a perpendicularly magnetized type perpendicular MTJ element using the perpendicularly magnetized film can be provided.

BRIEF DESCRIPTION OF DRAWINGS

FIG. 4 shows a bird's-eye view diagram and a side view diagram illustrating the atomic arrangement of the Ru underlayer surface, in which FIG. 4(A) shows the (02-23) plane of Ru, and FIG. 4(B) shows the (03-34) plane of Ru.

FIG. 11(A) is a graph showing the results of an out-of-plane scan, FIG. 11(B) is a graph showing the results of an in-plane scan in the [100] direction of an MgO substrate, while FIG. 11(C) is a graph showing the results of an in-plane scan in the [110] direction of an MgO substrate.

FIG. 12(A) is a graph showing the results for the (1-101) peaks of Ru, while FIG. 12(B) shows the results for the (-2110) peaks of Ru.

FIG. 13(A) is a graph showing the results of the case without heating treatment, while FIG. 13(B) is a graph showing the results of the case in which the heating temperature Tex=400° C.

FIG. 16 shows a bird's-eye view diagram and a side view diagram that schematically reproduce the atomic arrangements of MgO and CFA on the (02-23) plane of Ru.

FIG. 19(A) shows the [100] direction of MgO, while FIG. 19(B) shows the [110] direction of MgO.

FIG. 21(A) is a graph showing the results of scanning in the in-plane direction, while FIG. 21(B) is a graph showing the results of pole scanning of the (101) peaks.

FIG. 23(A) and FIG. 23(B) are images of a Re (30 nm) surface, FIG. 23(C) and FIG. 23(D) are images of a Fe (0.7 nm) surface, and FIG. 23(E) and FIG. 23(F) are images of an MgO (2 nm) surface.

FIG. 24(A) is a graph showing the results of scanning in the in-plane direction, while FIG. 24(B) is a graph showing the results of pole scanning of the (0002) peaks of Re.

DESCRIPTION OF EMBODIMENTS (A) Basic Structure

Hereinafter, an underlayer structure 1, a perpendicularly magnetized film structure 4, and a perpendicular type magnetoresistance element (perpendicular MTJ element film 9) related to respective embodiments of the present invention will be described in detail with reference to FIG. 1 to FIG. 6.

Figure 1:
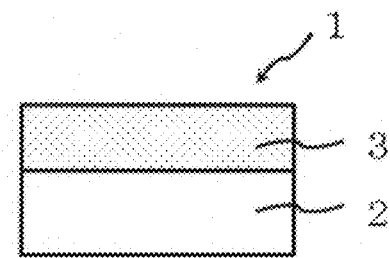
FIG. 1 is a cross-sectional view diagram illustrating the basic structure of an underlayer structure related to an embodiment of the present invention.

As illustrated in FIG. 1, the underlayer structure 1 according to an embodiment of the present invention comprises a substrate 2 and an underlayer 3. The substrate 2 is a magnesium oxide (MgO) single crystal having a sodium chloride (NaCl) structure and the (001) plane direction. Furthermore, the substrate 2 may be an in-plane polycrystalline MgO film oriented in the (001) orientation, or magnesium-titanium oxide (MgTiO$_x$) that has a NaCl structure and has an equivalent lattice constant may also be used instead of MgO.

Figure 2:
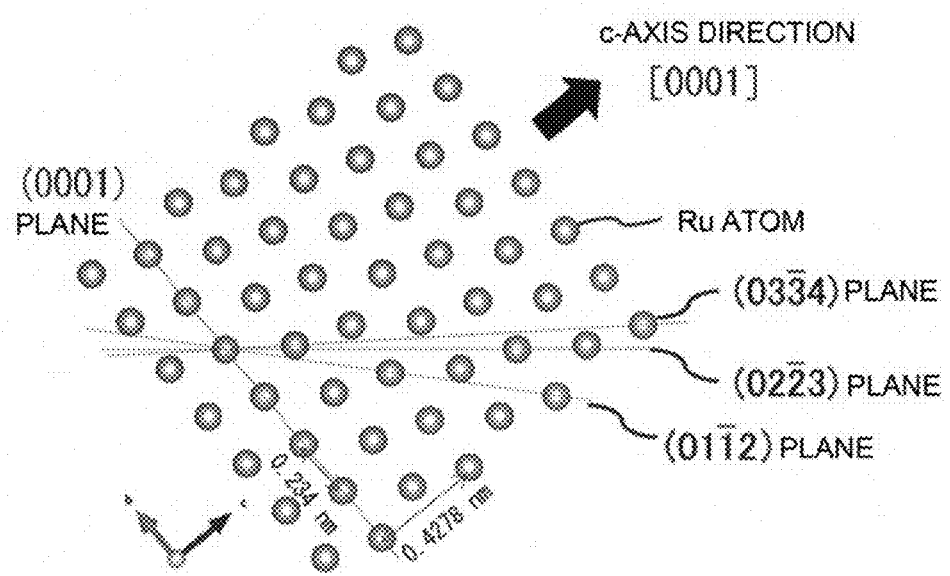
FIG. 2 is a diagram illustrating the relations between the Ru atomic arrangement, the crystal orientation, and the crystal planes of an underlayer structure related to an embodiment of the present invention.

The underlayer 3 is formed from a metal such as ruthenium (Ru) or rhenium (Re), the [0001] direction (c-axis) of the crystal of the metal is inclined from a direction perpendicular to the film plane, so that the thin film surface has a high direction plane. For example, in a case in which the metal is ruthenium (Ru), as illustrated in FIG. 2, the crystal planes of Ru include planes in the vicinity of from (01-12) orientation plane to the (03-34) orientation plane. The crystal planes form angles in the range of 42° to 54° with respect to the (0001) plane (c-plane), and for example, the (02-23) plane and the (03-35) plane are included in this range.

Figure 3:
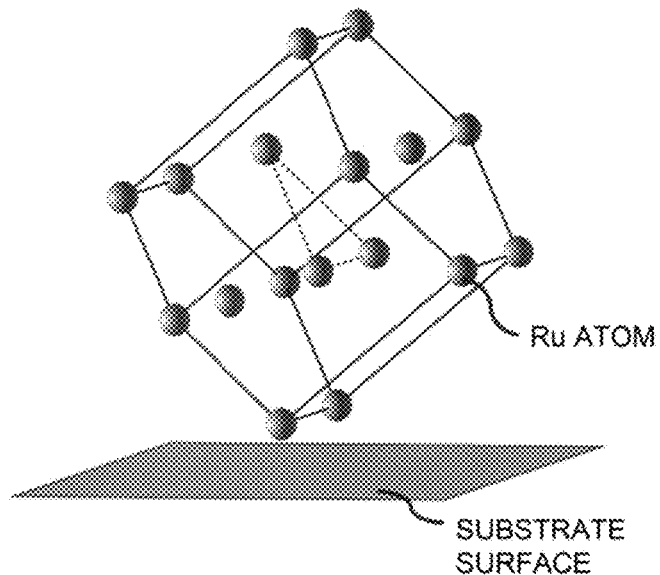
FIG. 3 is a diagram illustrating the relative relations between Ru grown in the (02-23) orientation and the substrate plane.
Figure 4:
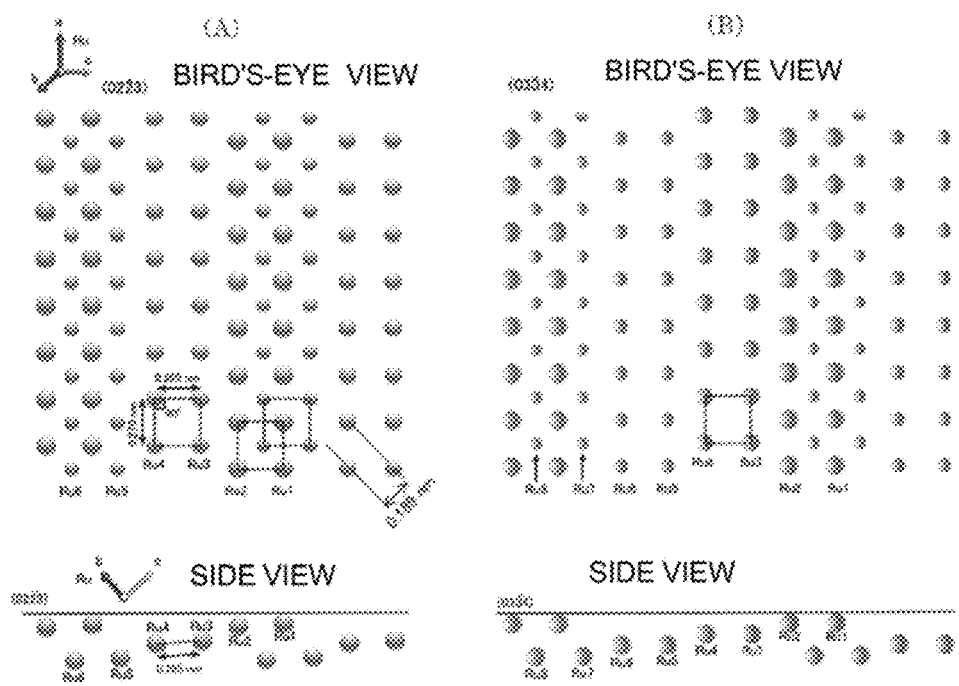

FIG. 3 illustrates, as a representative example, the relations between the hexagonal close-packed lattice of Ru grown in the (02-23) orientation and the substrate plane in a schematic diagram. From the difference in the crystal structure between MgO and Ru, a Ru layer is configured to include regions having different crystallographic directions (variants), and in a case in which epitaxial MgO is used as a substrate, the film has in-plane 4-fold symmetry as the whole film.

FIG. 4(A) schematically illustrates the crystal arrangement when the (02-23) plane is viewed from the Ru film top and from the side direction, and FIG. 4(B) similarly illustrates the crystal arrangement of the (03-34) plane. In FIG. 4(A) and FIG. 4(B), lattices of atomic arrangement aligned in a near square shape exist at the crystal surfaces of all Ru layers that function as underlayer 3. This square-shaped lattice is configured such that two layers of atomic planes present on the (03-34) plane become a pair (for example, a pair of Ru1 and Ru2). The interatomic distance of a square-shaped lattice obtainable from the lattice constant of Ru (a=0.2704 nm and c=0.4278 nm) is 0.265 to 0.270 nm, and the atomic plane distance in the diagonal direction is 0.189 nm.

Next, the perpendicularly magnetized film structure 4 according to an embodiment of the present invention will be described.

Figure 5:
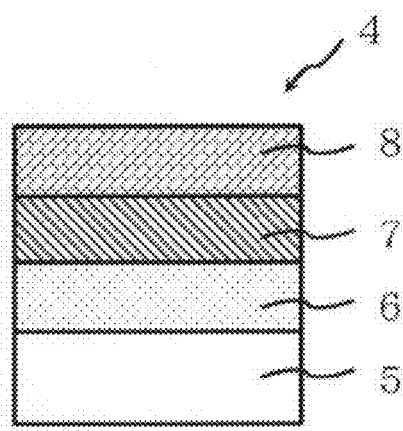
FIG. 5 is a cross-sectional view diagram illustrating the basic structure of a perpendicularly magnetized film structure related to an embodiment of the present invention.

As illustrated in FIG. 5, the perpendicularly magnetized film structure 4 has a substrate 5, an underlayer 6, a perpendicularly magnetized layer 7, and a non-magnetic layer 8 laminated in this order. The substrate 5 and the underlayer 6 are the same as the substrate 2 and the underlayer 3, respectively, of the underlayer structure 1 in the case of FIG. 1. The perpendicularly magnetized layer 7 has a cubic material that grows to have the (001) plane, for example, a cobalt (Co)-based full Heusler alloy or a cobalt-iron (CoFe) alloy having a bcc structure (Co$_{1-x}$Fe$_x$ (0≤x≤1)). A full Heusler alloy has a L2$_1$ type structure and has a chemical composition of Co$_2$YZ (wherein Y represents a transition metal, and Z mainly represents a typical element). The X and Y atom sites are represented by, for example, X=Fe, Cr, Mn and alloys thereof, and Y=Al, Si, Ge, Ga, Sn, and alloys thereof. As a form of the Co-based full Heusler alloy, in addition to the L2$_1$ type, a B2 structure, which is a structure in which the X and Y atom sites are disorderly arranged, is also acceptable. Furthermore, CoFe alloys also include cobalt-iron-boron (CoFeB) alloys containing boron.

On the perpendicularly magnetized layer 7, in addition to the materials described above, a tetragonal material that can utilize the square-shaped lattice of Ru, for example, a L1$_0$-based alloy XY (X=Fe or Co, and Y=Pt or Pd), a D0$_{22}$ type or L1$_0$ type manganese alloy, for example, a manganese-gallium (Mn—Ga) alloy or a manganese-germanium (Mn—Ge) alloy, are also capable of (001) growth, and therefore, these materials can be applied. It is because in these alloy materials, the lattice mismatch between such an alloy material and the Ru square-shaped lattice is as small as several percent (%) or less.

In a case in which a cubic material is used for the perpendicularly magnetized layer 7, when the layer is formed into an ultrathin film having a thickness of about 0.5 to 2 nm, and an oxide film of, for example, MgO, is disposed as the non-magnetic layer 8, a perpendicularly magnetized film is formed between the metal underlayer structure of Ru, Re or the like and the oxide film. In the case of a cubic perpendicularly magnetized film, this non-magnetic layer 8 is not necessarily essential.

Figure 6:
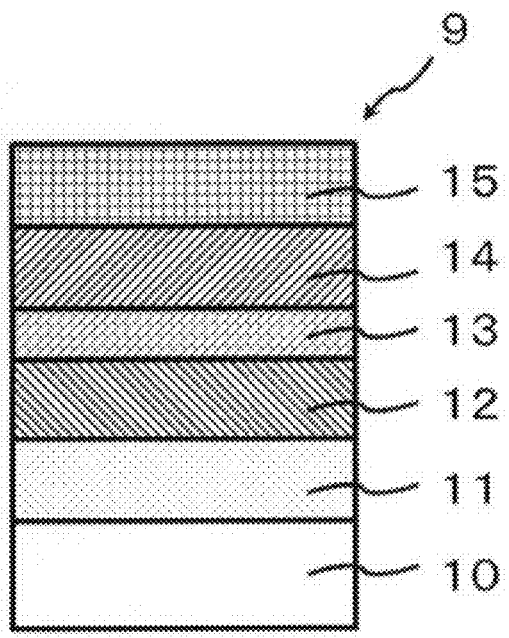
FIG. 6 is a cross-sectional view diagram illustrating the basic structure of a perpendicular magnetoresistance effect element structure related to an embodiment of the present invention.
Figure 7:
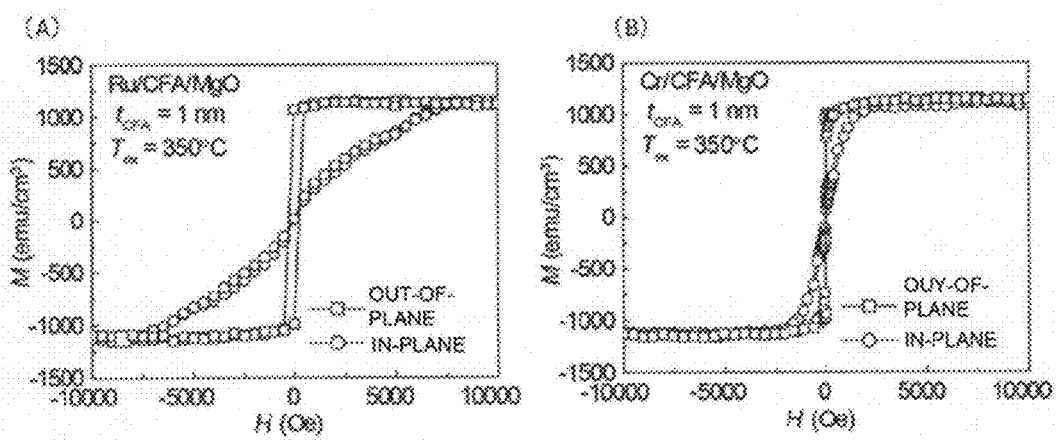
FIG. 7(A) is a graph showing the magnetic characteristics of a perpendicularly magnetized film structure using a Ru underlayer structure.
FIG. 7(B) is a graph showing the magnetic characteristics of a perpendicularly magnetized film structure using a Cr underlayer structure, which is a conventional structure.

Next, the perpendicular MTJ element film 9 according to an embodiment of the present invention will be described. For example, as illustrated in FIG. 6, the perpendicular MTJ element film 9 includes a substrate 10, an underlayer 11, a first perpendicularly magnetized layer 12, a non-magnetic layer 13, a second perpendicularly magnetized layer 14, and an upper electrode 15. The substrate 10, the underlayer 11, and the first perpendicularly magnetized layer 12 are the same as the substrate 5, the underlayer 6, and the perpendicularly magnetized layer 7 of the perpendicularly magnetized film structure 4, respectively. The second perpendicularly magnetized layer 14 is in direct contact with the non-magnetic layer 13, and the same structure and material as those of the first perpendicularly magnetized layer 12 can be used. Furthermore, this layer may also include a perpendicularly magnetized film having an amorphous structure, for example, a terbium-cobalt-iron (Tb—Co—Fe) alloy film.

The non-magnetic layer 13 is an oxide layer, and is not only used for the purpose of imparting perpendicular magnetic anisotropy, but also functions as a tunnel barrier in the MTJ element. In the following description, the non-magnetic layer 13 will be referred to as a tunnel barrier layer. Regarding the tunnel barrier layer 13, MgO, spinel ($MgAl_2O_4$), or aluminum oxide ($Al_2O_3$) can be employed as the constituent material, and the film thickness is from about 0.8 nm to 3 nm. In regard to $MgAl_2O_4$ and $Al_2O_3$, as long as the materials are cubic, they may have a structure with disorderly arranged cation sites. It is preferable that the tunnel barrier layer 13 grows in the (001) orientation and an orientation equivalent thereto. Thereby, the tunnel barrier layer 13 together with the first perpendicularly magnetized layer 12 and the second perpendicularly magnetized layer 14 function as a MTJ element in the (001) orientation, and therefore, a high TMR ratio is realized.

The upper electrode 15 is provided on the second perpendicularly magnetized layer 14. The upper electrode 15 has a laminate structure of metals of tantalum (Ta)/Ru, Re or the like. The thicknesses of the each layer of Ta and the metal are, for example, 5 nm and 10 nm, respectively.

For example, due to its high melting point (2334° C.), Ru has a smaller effect of atomic diffusion caused by a heating treatment compared to chromium (Cr), which is a conventional material, and has improved heat resistance. Therefore, in a case in which Ru is used as the underlayer 11, the constituent layers of a MTJ element or a magnetic recording medium layer can be subjected to a sufficient heating treatment for characteristics enhancement.

Furthermore, the Ru layer has an hcp structure, and has a crystal structure that is different from that of the cubic and tetragonal perpendicularly magnetized layers. Therefore, the connection between the respective crystals is appropriately weakened, compared to the case of a combination of identical crystal structures. Thereby, the effect of the distortion received from the underlayer can be weakened, and the characteristics of the perpendicularly magnetized layer can be enhanced by means of the production conditions. For example, for the MTJ element of the present embodiment, the magnetic anisotropy Ku and the TMR ratio characteristics can be enhanced.

It is definitely needless to say that the metal having an hcp structure according to the present invention may be of various kinds including rhenium (Re), in addition to ruthenium (Ru). For example, examples thereof include Ru and Re, as well as noble metals such as osmium (Os) and rhodium (Rh), and alloys thereof; titanium (Ti), zirconium (Zr), hafnium (Hf), and zinc (Zn).

In a case in which the underlayer structure according to an embodiment of the present invention is used as a perpendicular magnetic recording medium, the underlayer structure and the perpendicularly magnetized layer require a thin film structure formed from microcrystal grains having aligned crystal orientations. On a thermally oxidized Si substrate having an amorphous structure or on a glass substrate, a polycrystalline film of MgO or $MgTiO_x$ with (001) crystal orientation can be produced by sputtering film formation, and the polycrystalline film can be used as an underlayer for the underlayer structure of the present embodiment. For example, a thermal oxide film-coated Si substrate/MgO/Ru/ Co—Fe—Al alloy ($Co_2FeAl$):CFA structure can be utilized.

(B) Production Method

Hereinafter, the method for producing the underlayer structure 1, the perpendicularly magnetized film structure 4, and the perpendicular MTJ element film 9 according to the embodiments of the present invention will be described using FIG. 1, FIG. 5, and FIG. 6.

In the following, the production method will be explained by taking Ru as an example. First, regarding the method for producing a Ru layer as the metal underlayers 3, 6 and 11, the substrates 2, 5 and 10 are produced with MgO having the (001) plane, and film formation of a Ru thin film is performed by radiofrequency (RF) sputtering using an ultrahigh vacuum magnetron sputtering apparatus (ultimate vacuum: about $3 \times 10^{-7}$ Pa). The thickness of the Ru film is, for example, 40 nm; however, if the film becomes a flat film, the film may be even thinner. Subsequently, a post-annealing treatment is performed at 200° C. to 600° C. in a vacuum, and thereby control of the crystal orientation plane is conducted. The angle formed at this time by the c-axis direction of Ru and the MgO substrate plane forms an angle in the range of 42° to 54°.

The CFA, which is a Co-based Heusler alloy, is formed on the Ru underlayer. This CFA layer constitutes the perpendicularly magnetized layer 7 and the first perpendicularly magnetized layer 12. CFA is known as a material having high spin polarization, and when CFA is used as a ferromagnetic layer of a MTJ element, a very high TMR ratio can be obtained. CFA layer generally has a B2 structure, and there is irregularity between Fe sites and Al sites. As the degree of order of B2 is higher, spin polarization is higher, and the TMR ratio thus obtainable becomes high. The CFA layer can be formed by sputtering film formation from a Co—Fe—Al alloy target (molten target, representative composition 50:25:25 atomic %). The film thickness of the CFA layer is about 0.5 to 1.5 nm, which is suitable for obtaining perpendicular magnetization. For the CFA layer formation, a vacuum electron beam evaporation method or a co-sputtering method from plural targets can be utilized. At this time, the Ru square-shaped lattice is used as a template for crystal growth, and the (001) growth of cubic crystals is prompted. At the time of forming the CFA layer, when the substrate temperature is adjusted to 150° C., a B2 ordered structure is obtained during film forming, and also, flatness of the film can be secured. In addition to CFA, a material having a lattice constant that is close to that of a cubic, for example, a Co-based Heusler alloy other than CFA, or a CoFe having a bcc structure can be used.

Next, an MgO layer as the tunnel barrier layer 13 is formed on the CFA layer thus produced, so as to have a film thickness of, for example, about 1 to 2 nm. For the MgO film formation, direct RF sputtering film formation from an MgO target, or a method of forming a film of magnesium (Mg) metal by sputtering and then subjecting the magnesium to an oxidation treatment, can be used. After the MgO layer is formed, the crystal quality can be enhanced by performing a post-annealing treatment at about 200° C. As the (001) orientation properties are enhanced, a higher TMR ratio is obtained.

Subsequently, a CoFeB amorphous layer is formed as the second perpendicularly magnetized layer 14 by sputtering film formation, and the film thickness is adjusted to, for example, 1.3 nm. Then, for example, Ta having a film thickness of 5 nm, and for example, a Ru layer having a film thickness of 10 nm are formed together thereon as the upper electrode 15 by sputtering film formation. The concentration of boron (B) of the Co—Fe—B layer is decreased as boron undergoes atomic diffusion into the Ta layer by a heating treatment, and thereby crystallization occurs from the MgO tunnel barrier layer. Thus, the structure changes to a bcc structure having the (001) plane. Thereby, a first perpendicularly magnetized layer 12/tunnel barrier layer 13/second perpendicularly magnetized layer 14 structure grows in the (001) orientation, and therefore, a high TMR ratio is obtained. In order to promote this crystallization, a crystalline CoFe layer having a thickness of 0.1 to 0.3 nm can be inserted between the MgO layer and the CoFeB layer.

(C) Characteristics

Next, the characteristics of the perpendicularly magnetized film of the present embodiment and a magnetoresistance effect element using the perpendicularly magnetized film will be explained in the following Examples with reference to FIG. 7 to FIG. 10.

EXAMPLE 1

(Perpendicular Magnetic Anisotropy)

An example of forming an MgO substrate/Ru/CFA/MgO structure as a perpendicularly magnetized film structure by sputtering film formation will be described. In order to confirm the perpendicular magnetization characteristics, the CFA film thickness was varied from 0.5 nm to 2.1 nm at an interval of 0.1 nm. The MgO film thickness was set to 1.8 nm. For characteristics improvement, an annealing treatment in a vacuum was performed at a temperature in the range of Tex=250° C. to 450° C.

FIG. 7(A) shows a curve (magnetization curve) of magnetization (M) at room temperature against an external magnetic field (H) for an MgO substrate/Ru/CFA/MgO structure in a case in which the CFA layer film thickness, $t_{CFA}$, was set to 1 nm, and the heating temperature, Tex, was set to 350° C. Both the out-of-plane direction (a direction perpendicular to the film plane) magnetic field and the in-plane magnetic field are shown. In the case of the out-of-plane direction magnetic field, magnetization is easily inverted with respect to an external magnetic field, and magnetization is saturated in a small magnetic field; however, in the in-plane magnetic field, it is difficult to induce magnetization. Therefore, the structure has a large perpendicular magnetic anisotropy. The perpendicular magnetic anisotropy energy density (Ku) is a value corresponding to a region surrounded by the curve for the out-of-plane magnetic field and the curve for the in-plane magnetic field, and the value means that in a case in which this area is large, the system has a large value of Ku. In FIG. 7(A), the value of Ku in the case of using the Ru underlayer of the embodiments of the present invention was $3.1 \times 10^6$ emu/cm$^3$.

FIG. 7(B) shows a magnetization curve in the case in which Cr, which is a conventional underlayer, was used as a Comparative Example. In the Comparative Example, a laminate structure of Cr (40 nm)/CFA (1 nm)/MgO (2 nm) at an annealing temperature of Tex=350° C. is used. A perpendicularly magnetized film is obtained also in this case; however, Ku was small compared to the case of using a Ru underlayer, and the value of Ku was $8 \times 10^5$ emu/cm$^3$. Therefore, according to the embodiments of the present invention, by using a Ru underlayer instead of Cr of Comparative Example, the value of Ku increased to four times.

Figure 8:
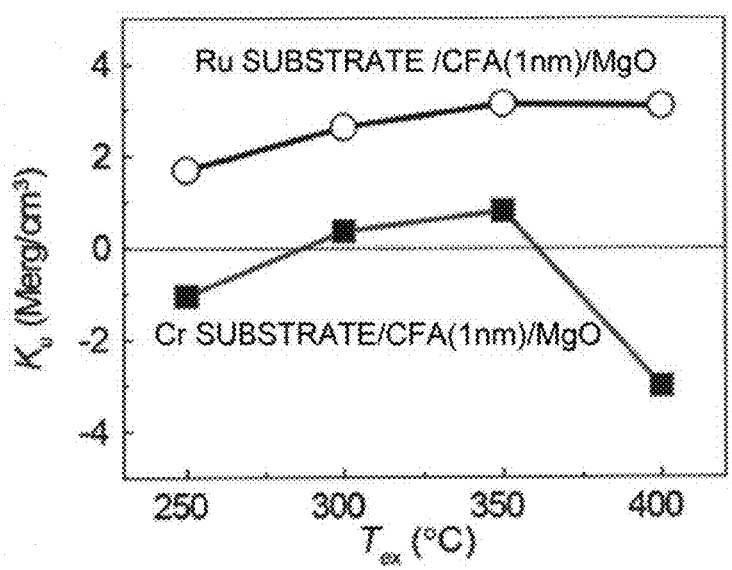
FIG. 8 is a graph showing a comparison between a Ru underlayer structure and a Cr underlayer structure as a conventional structure, in connection with the relations between the perpendicular magnetic anisotropy, Ku, and the heating treatment temperature, Tex.
Figure 9:
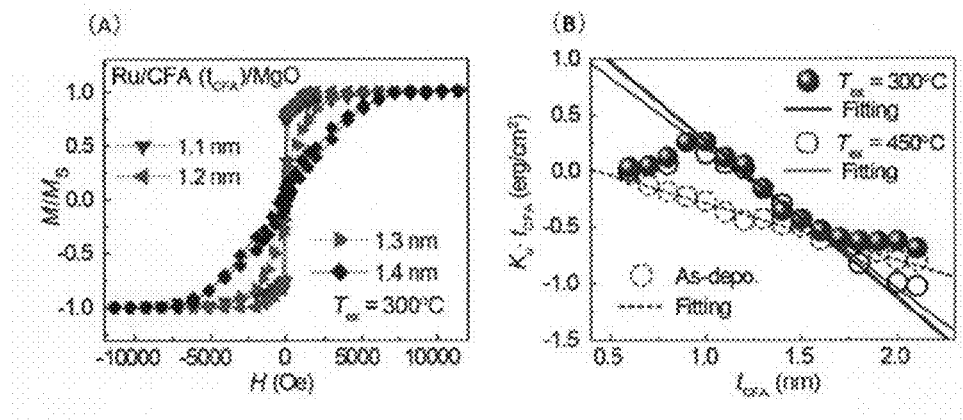
FIG. 9(A) is a graph showing the relations between the magnetic characteristics of a perpendicularly magnetized film structure using a Ru underlayer structure and the CFA film thickness, $t_{CFA}$.
FIG. 9(B) is a graph in which the product of the perpendicular magnetic anisotropy, Ku, and the CFA film thickness, $t_{CFA}$, is plotted against $t_{CFA}$.

FIG. 8 shows the dependence of Tex on Ku in both cases of a Ru underlayer and a Cr underlayer. At this time, the $t_{CFA}$ was set to 1 nm. A positive Ku in FIG. 8 represents a perpendicularly magnetized film, and a negative Ku represents an in-plane magnetized film. In the case of a Ru underlayer, perpendicular magnetization occurs over the whole range of Tex of 250° C. to 400° C. On the other hand, in the case of a Cr underlayer, perpendicular magnetization occurs only in a narrow range of Tex of 300° C. to 350° C., and particularly, at Tex=400° C., the value of Ku is markedly lowered. This is because the Cr layer and the CFA layer diffused into each other, and the magnetic characteristics of the CFA layer were significantly degraded. In the case of a Ru underlayer, this underlayer always presents a larger value of Ku than a Cr underlayer, and in the range of Tex described above, degradation of perpendicular magnetic anisotropy is not observed. That is, it is implied that in a case in which a Ru underlayer is used, the perpendicularly magnetized film can be adapted to an annealing treatment at high Tex.

FIG. 9(A) shows a magnetization curve when the $t_{CFA}$ is varied for an MgO substrate/Ru/CFA/MgO structure. From this diagram, it can be seen that when the $t_{CFA}$ is between 1.2 nm and 1.3 nm, the perpendicularly magnetized film is converted to an in-plane magnetized film. FIG. 9(B) is a diagram in which the product of Ku and $t_{CFA}$ at various Tex values is plotted against $t_{CFA}$. The term "As-depo." means a sample that was not subjected to an annealing treatment after the formation of a film structure. In a case in which the product of Ku and $t_{CFA}$ is positive, this indicates perpendicular magnetization. Therefore, a perpendicularly magnetized film is obtained at Tex=300, 450° C. and at a $t_{CFA}$ in the range of 0.6 to 1.2 nm.

Meanwhile, perpendicular magnetization is hardly attained in the As-depo. state; however, this is not due to the Ru underlayer, but because the quality of the crystal structure at the CFA/MgO interface is insufficient.

The solid line in FIG. 9(B) is a straight line obtained by fitting using the following formula.

$$Ku \cdot t_{CFA} = (Kv - 2\pi Ms^2) t_{CFA} + Ks \quad (1)$$

Here, Ms represents saturation magnetization (in the case of a CGS unit system, unit: emu/cm$^3$), Kv represents the crystal magnetic anisotropy energy density (unit: erg/cm$^3$), and Ks represents the interface anisotropy energy density at the MgO/CFA interface (unit: erg/cm$^2$). From the fitting calculation, Kv is negative, and the CFA layer itself exhibits in-plane magnetic anisotropy in a case in which the MgO tunnel barrier layer is absent. On the other hand, Ks is a segment of FIG. 9(B), and is positive at any Tex. Therefore, the CFA layer becomes a perpendicularly magnetized film as a result of a quantum mechanics effect at the interface between the CFA layer and the MgO tunnel barrier layer. At Tex=350° C., the maximum value of Ks was 2.2 erg/cm$^2$. This value was twice or more compared to 1.0 erg/cm$^2$, which was a value in the case of using a Cr underlayer in Comparative Example.

EXAMPLE 2

(Magnetoresistance Effect)

As a MTJ element using a perpendicularly magnetized film, an MgO substrate/Ru (40 nm)/CFA (1.2 nm)/MgO (1.8 nm)/Fe (0.1 nm)/Co$_{20}$Fe$_{60}$B$_{20}$ (1.3 nm)/Ta (5 nm)/Ru protection layer (10 nm) structure is described as an example. The annealing temperature Tex after the production of the film structure was set to 325° C.

Figure 10:
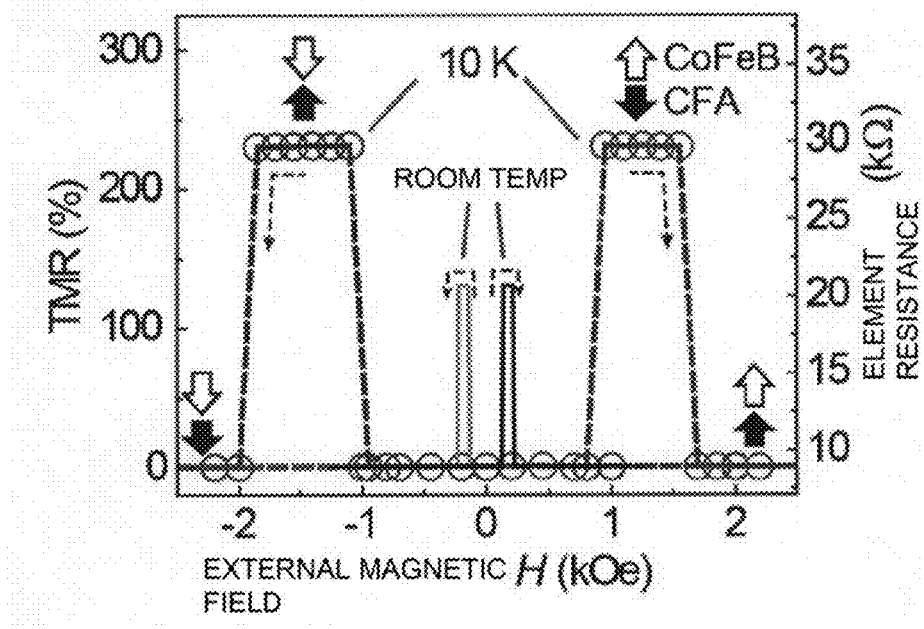
FIG. 10 is a graph in which the TMR ratio and the element resistance of a perpendicular MTJ element using a Ru underlayer structure is plotted against an external magnetic field.

FIG. 10 shows the results for the dependence of the magnetoresistance change (TMR) ratio on an external magnetic field (H) in an out-of-plane direction plane at room temperature and a low temperature (10 K). The black and white arrows in the diagram represent the direction of magnetization of a CFA layer and a Fe/CoFeB layer, respectively. Since steep resistance changes with respect to the magnetic field are observed, the CFA layer as the first perpendicularly magnetized layer and the Fe/CoFeB layer as the second perpendicularly magnetized layer both become perfectly perpendicularly magnetized films, and it is implied that a parallel magnetization state and an anti-parallel magnetization state are realized in the range of the magnetic field used for analysis. The TMR ratio, which is defined as the tunnel resistance change ratio at the time of the parallel magnetization state and at the time of the anti-parallel magnetization state, was 132% at room temperature. This value is significantly large compared to 91% in the case of using a Cr underlayer in Comparative Example. The TMR ratio at low temperature was 237%. This increase in the TMR ratio caused by using a Ru underlayer is mainly caused by factors such as that the influence of Ru crystals is relatively small, and thereby quality enhancement of the CFA/MgO/Fe/CoFeB structure grown thereon was promoted, that the degree of (001) orientation became high, and that the influence of atomic diffusion between the laminate structure and the underlayer is small.

(D) Crystal Structure

Next, the crystal structures for the underlayer structure and the magnetized film structure of the present embodiment will be explained with reference to FIG. 11 to FIG. 22.

Figure 11:
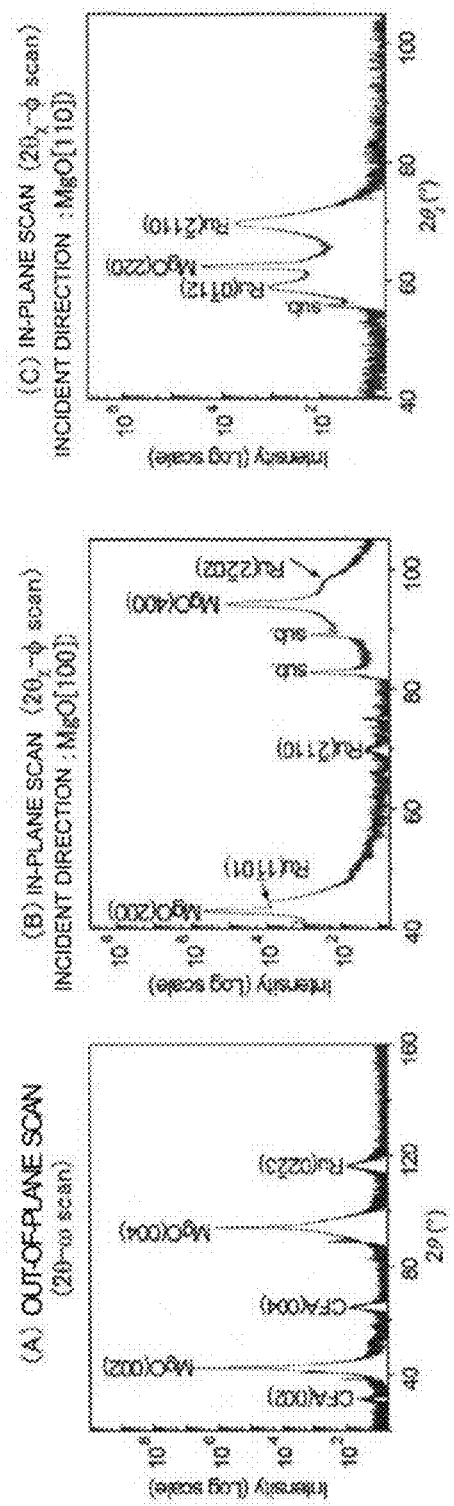
FIG. 11 shows X-ray diffraction patterns (CuKα radiation source) of a Ru underlayer structure/CFA 20 nm laminate structure.
Figure 12:
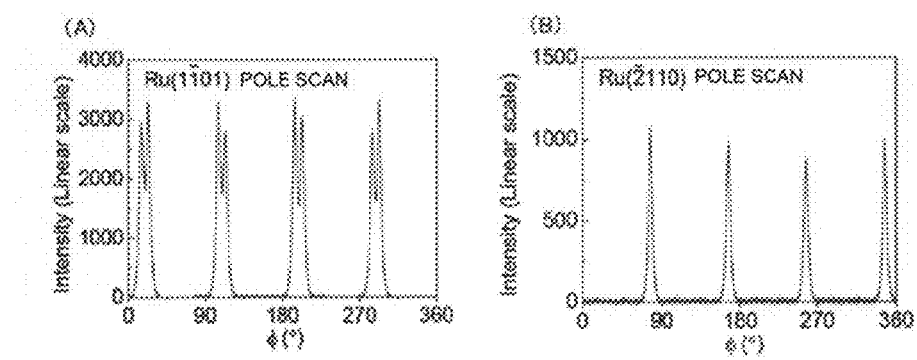
FIGS. 12(A) and 12(B) show the results of X-ray pole scanning analysis (CuKα radiation source) of a Ru underlayer structure.

FIG. 11 shows the results of X-ray diffraction using a copper (Cu) Kα radiation source for a sample in which a 20 nm CFA was produced on a 40-nm Ru underlayer on an MgO substrate. FIG. 11(A) shows the diffraction pattern in a case in which X-radiation was scanned in the out-of-plane direction (2θ–ω scan); FIG. 11(B) shows the diffraction pattern in a case in which X-radiation enters in parallel with the [100] direction of the MgO substrate, and scanning in the in-plane direction ($2\Theta_{x-\varphi}$ scan) was performed; and FIG. 11(C) shows the diffraction pattern of $2\Theta_{x-\varphi}$ scan in a case in which X-radiation enters in the [110] direction of the MgO substrate. It can be seen from FIG. 11(A) that the diffraction peak originating from Ru is (02-23) only. In FIG. 11(B) and FIG. 11(C), diffraction peaks originating from the (1-101), (-2110) and (0-112) from the Ru layer are observed in the $2\Theta_{x-\varphi}$ scan. FIG. 12(A) and FIG. 12(B) show the results of pole scan (φ scan) corresponding to the (1-101) plane and (-2110) plane, respectively. In both cases, peaks are obtained at an interval of 90°, and thus, it is understood that the film is an epitaxial film having a 4-fold symmetry. This 4-fold symmetry indicates that the Ru in FIG. 3 comprises four variant regions that rotates 90° each within the plane of the film. Furthermore, it is also understood from FIG. 12(A) that the (1-101) peaks have a structure split into two. This corresponds to the fact that (1-101) is slightly oblique from the MgO [100] direction, as will be explained below.

Figure 13:
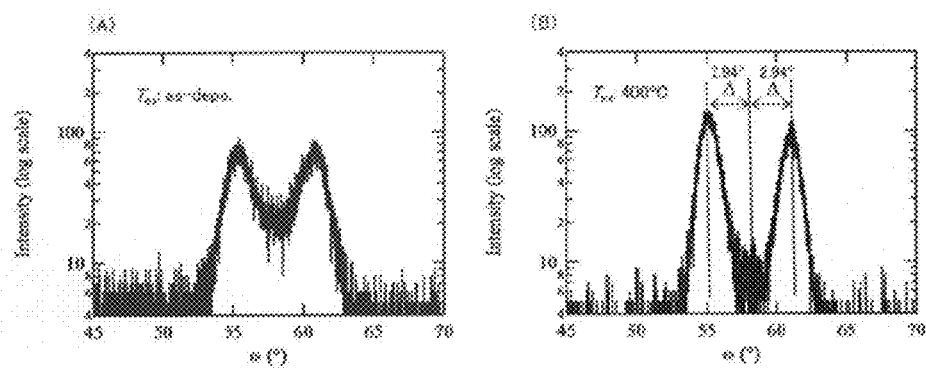
FIG. 13 shows the results of X-ray rocking curve analysis (CuKα radiation source) of the (02-23) peaks of Ru of a Ru underlayer structure.

FIG. 13 shows a rocking curve (ω scan) of the (02-23) peak shown in the X-ray diffraction pattern in the out-of-plane direction, which was obtained in FIG. 12(A). Due to the existence of variants, in both cases of without an annealing treatment (as-depo.) (FIG. 13(A)) and Tex=400° C. (FIG. 13(B)), peaks exhibit a structure split into two. Through an annealing treatment, the (02-23) peaks of in the diffraction pattern out of film plane become smaller, and the peaks of the rocking curve are clearly decomposed into two with an angle of 2.94°. This implies that, as will be described below, the Ru layer was rearranged into the (03-35) direction, which is a direction more optimal than the (02-23) direction, through the heat treatment.

Figure 14:
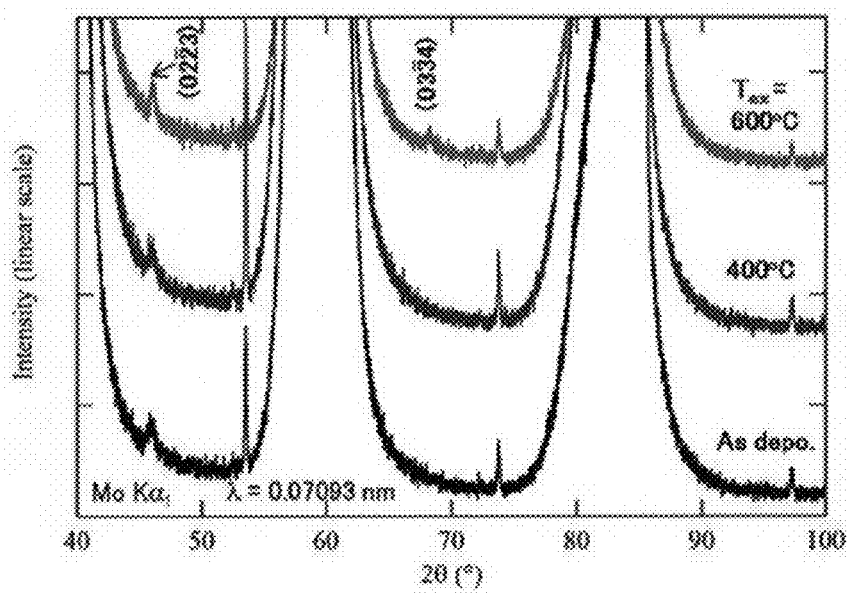
FIG. 14 is a graph showing the X-ray film in-plane diffraction pattern (MoKα radiation source) of a Ru underlayer structure.

FIG. 14 shows the results of 2θ-ω scan performed using a molybdenum (Mo) Kα radiation source in order to obtain a diffraction pattern from high plane indices of a Ru underlayer. The sample used was 40-nm Ru grown on MgO, and the Tex was set to as-depo., 400° C., and 600° C. For all of the samples, it can be seen that the (02-23) peak appears, and at 600° C., (03-34) peak appears in addition to this (02-23) peak. Furthermore, since other Ru peaks are not observed, it was confirmed that a Ru underlayer structure having crystal planes in the vicinity from (02-23) to the (03-34) was realized.

Figure 15:
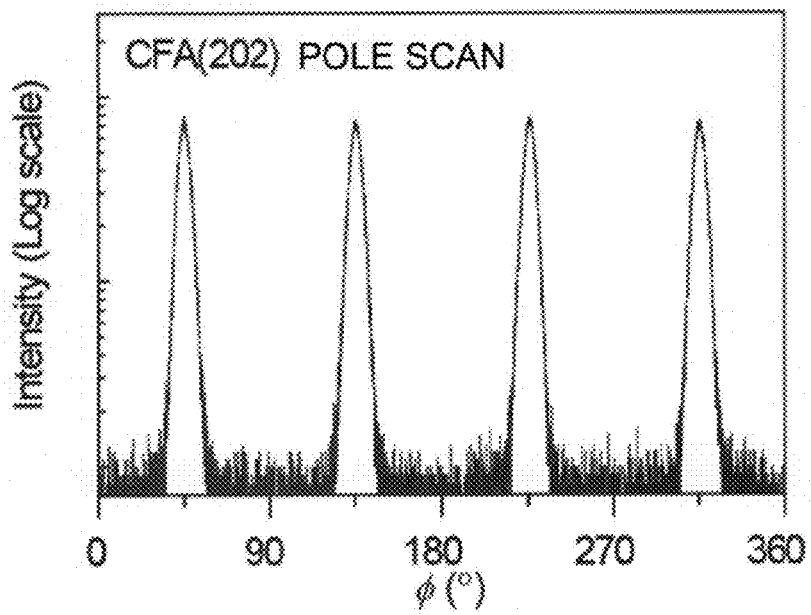
FIG. 15 is a graph showing the results of X-ray pole scanning analysis (CuKα radiation source) of the (202) peaks of CFA (20 nm) formed on a Ru underlayer structure.

In the 2θ-ω scan (FIG. 11(A)) of the sample of Ru (40 nm)/CFA (20 nm), it can be seen that only (002) and (004) are observed as the peaks of the CFA layer, and the CFA layer grows in the (001) orientation. From the intensity ratio of the (002) peak and the (004) peak, the degree of order of B2 was calculated, and the calculated value was almost equal to the theoretical value. Therefore, it was found that CFA had a nearly perfect B2 structure. Furthermore, FIG. 15 shows the results of φ scan in the (202) plane of CFA. The 4-fold symmetry originating from the B2 structure of CFA is observed, and CFA is obtained as an epitaxial film. Therefore, a Ru layer that grows with a highly crystalline plane is acknowledged to be effective as an underlayer for a high-quality CFA film with a B2 order.

A result obtained by schematically reproducing the atomic arrangements of an MgO substrate and a CFA film on the (02-23) plane of Ru based on the results described above, is presented in FIGS. 16(A) and 16(B). A plane intersecting the crystal plane shown in the X-ray diffraction pattern is also shown. It can be seen that the square-shaped lattice of Ru overlaps with the lattices of MgO and CFA. Furthermore, the reason why the peaks of pole scan of (1-101) in FIG. 12(A) have a structure split into two, is that the intersection plane of (1-101) of Ru has a gradient of 40.5° in the [110] direction of MgO, that is, 4.5° in the [100] direction of MgO.

Figure 17:
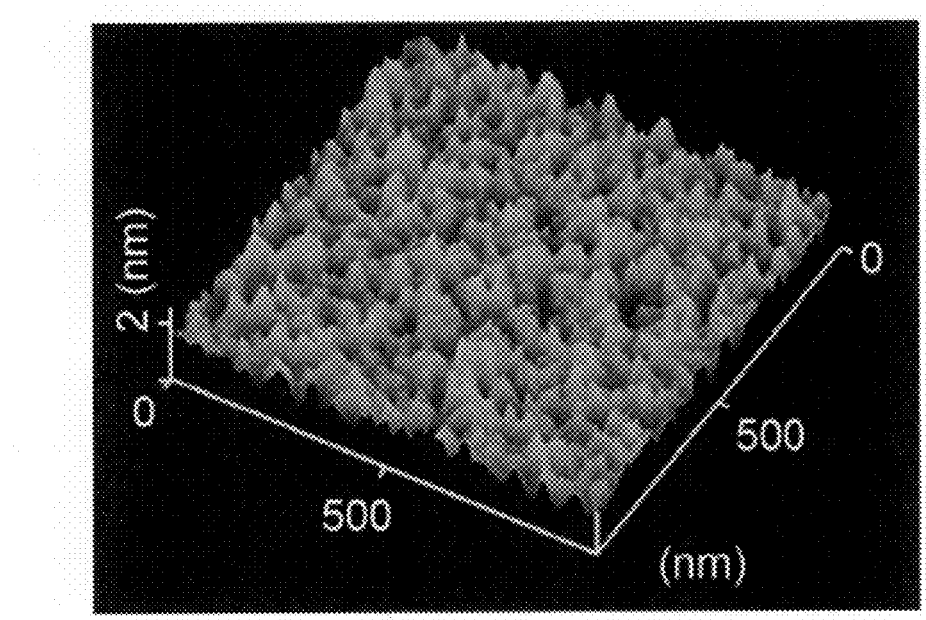
FIG. 17 is a diagram showing an atomic force microscopic image of the surface of a Ru underlayer structure/CFA (1 nm) sample.
Figure 18:
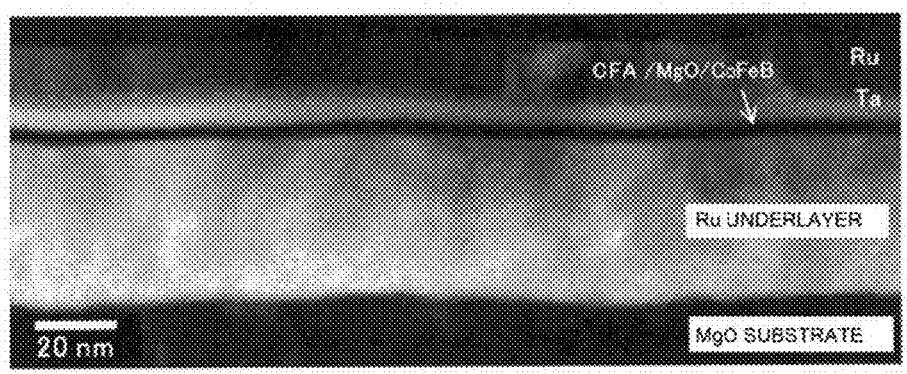
FIG. 18 is a diagram showing a high-angle scattering annular dark-field scanning transmission microscopic image of a perpendicular MTJ element cross-section using a Ru underlayer structure.
Figure 19:
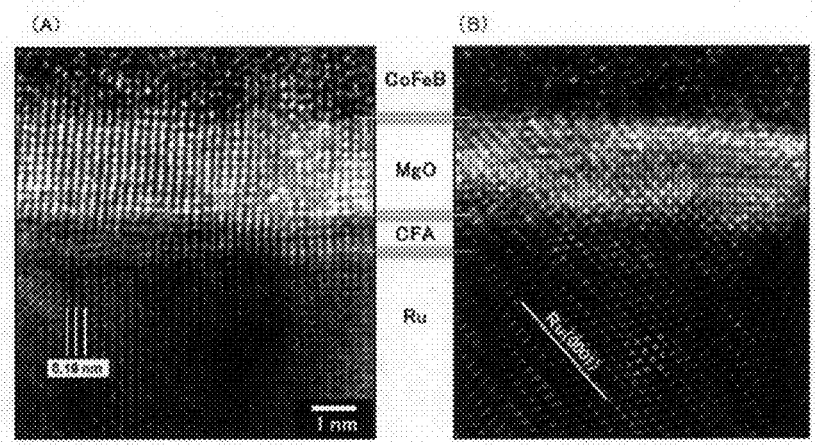
FIG. 19 shows a high resolution transmission electron beam microscopic image of a perpendicular MTJ element cross-section using a Ru underlayer structure.
Figure 20:
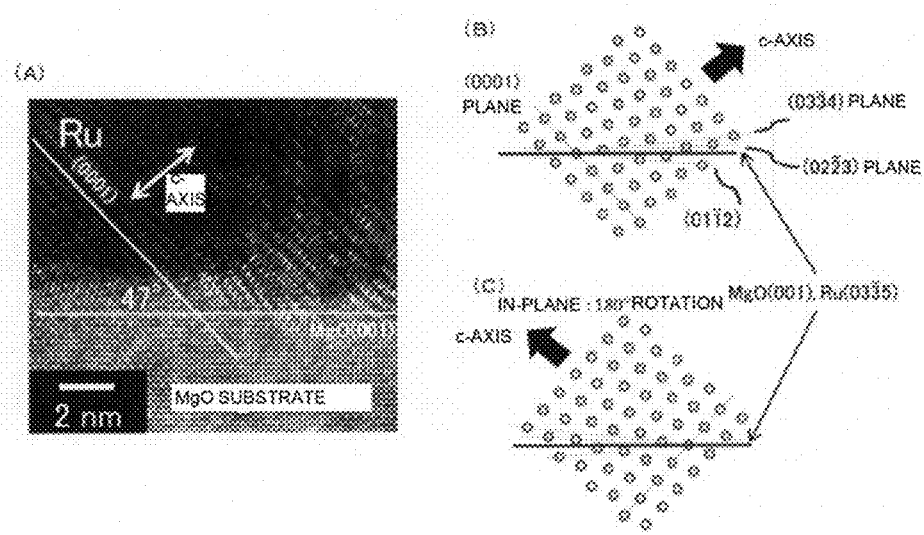
FIG. 20(A) is a high resolution transmission type electron beam microscopic image of the [110] direction of MgO in the vicinity of the interface between an MgO substrate and a Ru underlayer structure.
FIG. 20(B) is a diagram schematically illustrating the Ru atomic arrangement and the (001) plane of MgO of FIG. 20(A).
FIG. 20(C) is a graph obtained by rotating FIG. 20(B) by 180° within the plane.

FIG. 17 shows the results of observing the surface of a sample having an MgO substrate/Ru (40 nm, annealed at 400° C.)/CFA (1 nm) structure using an atomic force microscope (AFM). The average roughness Ra is 0.24 nm, which means flatness; however, it is seen that the surface has an undulation having a size of about 30 nm. In order to clarify the relation between this undulation and Ru, and the structure, the results obtained by observing a cross-section of a perpendicular MTJ element film having an MgO substrate/ Ru (40 nm)/CFA (1.2 nm)/MgO (1.8 nm)/Fe (0.1 nm)/ $Co_{20}Fe_{60}B_{20}$ (1.3 nm)/Ta (5 nm)/Ru protection layer (10 nm) structure (Tex=325° C.), using a high-angle scattering annular dark-field scanning transmission microscope (HAADF-STEM), are shown in FIG. 18. A dark region represents a CFA/MgO/CoFeB structure. It is also understood that the surface of the Ru layer has an undulation having a period of about 30 nm similarly to the AFM results, and this undulation period is approximately the same as the undulation period of the MgO substrate. Since the local diffraction image pattern obtained by nanobeam electrons generally varies with the undulation, it can be seen that the period of the undulation is correlated to the domain size of variants. From the above results, the undulation structure is related to the surface unevenness of the substrate and the domain size of the variant; however, the undulation structure is not a disorder in the structure in an atomic scale that affects the perpendicular magnetic anisotropy or the TMR ratio.

Furthermore, in order to definitely clarify the Ru structure, an observation of high-resolution transmission electron beam microscope (HRTEM) images was performed at cross-sections in the [100] direction and the [110] direction with respect to an MgO substrate. FIG. 19(A) shows an HRTEM image of the vicinity of the CFA layer in the [100] direction of MgO, and FIG. 19(B) shows an HRTEM image of the vicinity of the CFA layer in the [110] direction of MgO. From FIG. 19(A), cross stripes in the in-plane direction of Ru are observed, and the spacing is about 0.19 nm. This value is almost consistent with 0.189 nm, which is the atomic plane spacing predicted along the diagonal of the square-shaped array of Ru that is schematically illustrated in FIG. 4(A). Furthermore, the crystal lattice of CFA is extended for about 3% in the in-plane direction due to the presence of an MgO tunnel barrier layer, and it can be seen that there is a non-negligible tetragonal distortion. This distortion under tensile force in the in-plane direction has a function of weakening the perpendicular magnetic anisotropy.

However, it is shown that when the Ru underlayer of the present embodiment is used, the effect of increasing the perpendicular magnetic anisotropy as a result of quality enhancement of a CFA/MgO interfacial structure dominates this cubic distortion. At the same time, it is implied that the Ru underlayer functions not only as an underlayer for cubic crystals but also as an underlayer for tetragonal crystals.

FIG. 19(B) shows the direction of observation corresponding to FIG. 2, and the same atomic arrangement is predicted. As illustrated with dots in FIG. 19(B), the atomic arrangement is consistent with the atomic arrangement of the vicinity of the (02-23) plane of Ru. From these, it can be seen that the structure obtained by X-ray diffraction is maintained even in very local regions. It was also confirmed that a perpendicularly magnetized CFA layer has a B2 structure. Furthermore, it was also confirmed that the MgO layer had a NaCl structure, and grew in the (001) orientation. Thus, it is valid to obtain a large Ku and a high TMR ratio.

In order to confirm the direction of growth of Ru with respect to an MgO substrate, an HRTEM image (MgO [110] direction) of the vicinity of a substrate having an underlayer structure of MgO substrate/Ru (40 nm, Tex=400° C.) is shown in FIG. 20(A). It can be seen that the angle formed by the MgO (001) plane and the Ru (0001) plane is about 47°. This relation is schematically illustrated in FIG. 20(B), and this angle corresponds to the fact that Ru grows to have the (03-35) orientation. The (03-35) plane is a highly directional plane existing between the (01-12) plane and the (02-23) plane. Since (03-35) is a forbidden line for X-radiation and electron beams, (03-35) cannot be identified directly by X-ray diffraction and electron beam diffraction. However, (03-35) can be indirectly identified from a rocking curve of (02-23) of FIG. 13(B). First, a peak that has split into two represents diffraction from another variant that underwent 180° in-plane rotation, as compared to FIG. 20(B) and FIG. 20(C), and indicates that the peaks are growing in a direction inclining by an increment of Δ=2.94° each from the (02-23) direction. Furthermore, the intensity at the center of the split peak becomes weak, and this indicates that the crystal direction of the Ru underlayer is oblique from (02-23). The calculated value of the angle formed by the (02-23) plane and the (03-35) plane was 2.99°, and this is almost consistent with Δ=2.94° obtained in FIG. 13(B). Therefore, it is concluded that a Ru underlayer that was subjected to a heating treatment at Tex=400° C. has a highly directional plane of the (03-35) plane in both HRTEM and X-ray diffraction.

From the structural analysis described above, it was found that regarding Ru, the (02-23), (03-35) and (03-34) planes are obtained by the annealing treatment temperature, and rearrangement occurs in an optimal plane. All of the crystal planes function effectively as an underlayer for a cubic crystal material due to the presence of square-shaped lattices at the surface of the Ru underlayer.

EXAMPLE 3

Figure 21:
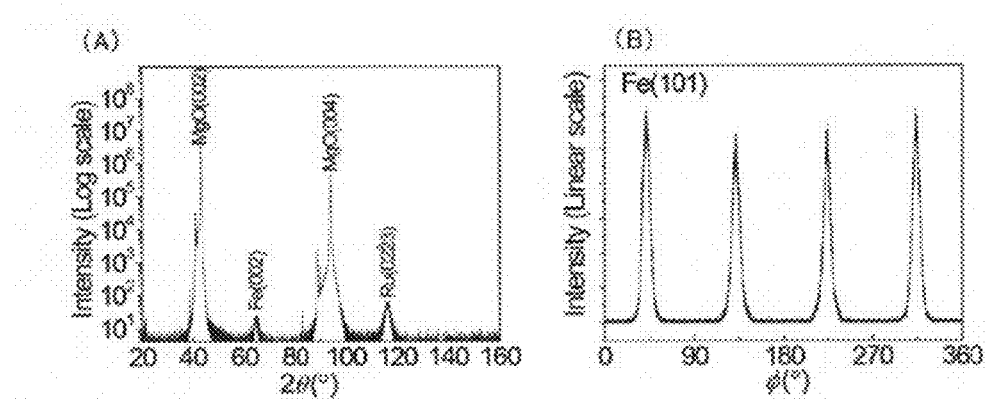
FIG. 21 shows the X-ray diffraction pattern (CuKα radiation source) of a Ru underlayer structure/Fe 20 nm laminate structure.

Next, the X-ray diffraction pattern obtained by forming iron (Fe) having a bcc structure on Ru as a ferromagnetic layer is shown in FIG. 21. The thickness of the Fe layer was set to 20 nm. From the 2θ-ω scan of FIG. 21(A), only the (002) peak is obtained in the Fe layer, and the Fe layer is formed by growing in the (001) plane direction, similarly to the CFA layer. Furthermore, from φ scanning of Fe (101) of FIG. 21(B), 4-fold symmetric peaks are observed, and epitaxial growth can be identified. Therefore, Ru effectively functions as an underlayer also for cubic materials other than CFA.

EXAMPLE 4

Figure 22:
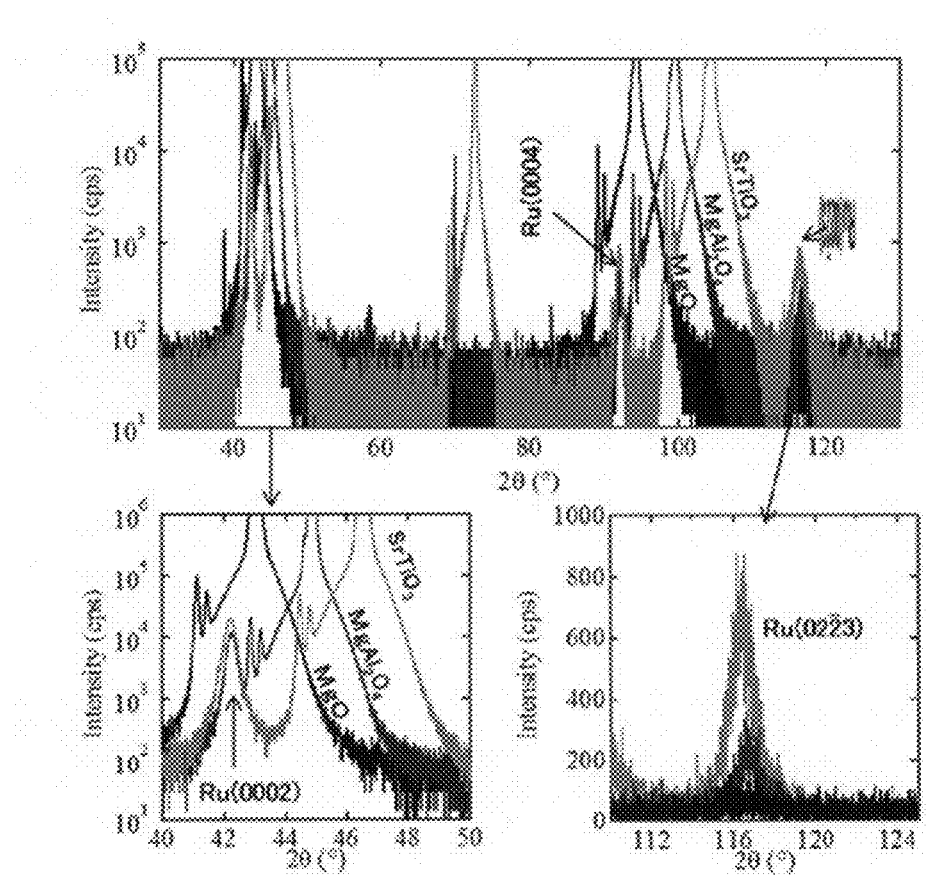
FIG. 22 is a graph showing the film in-plane X-ray diffraction patterns (CuKα radiation source) of a Ru underlayer structure formed on an MgO (001) substrate, a MgAl$_2$O$_4$ (001) substrate, and a SrTiO$_3$ (001) substrate.

Next, in order to confirm the influence of an MgO substrate, 40-nm Ru was formed using single crystal substrates of cubic SrTiO₃ (lattice constant: 0.385 nm) and MgAl₂O₄ (lattice constant 0.808 nm), which have lattice constants different from that of MgO (lattice constant 0.421 nm). The results of 2θ-ω scan are shown in FIG. 22. For all of the substrates, the (02-23) peak of Ru is observed; however, Ru (0002) and Ru (0004) peaks that are not identified in MgO are observed at the same time. Therefore, both the (0001) growth and the high index plane growth are available together. Therefore, it is understood that for the growth of a Ru underlayer, it is more preferable to use MgO.

(E) Summary

A comparison is made in Table 1 in connection with the difference in the crystal structure between the Ru underlayer structure of the present embodiment and a Cr underlayer structure, which is a conventional structure, and a comparison is also made for the perpendicular magnetic characteristics and the TMR ratios of CFA perpendicularly magnetized films constructed using those underlayer structures.

TABLE 1

| Item | Ru underlayer structure | Cr underlayer structure |
| --- | --- | --- |
| Crystal structure | Hexagonal close-packed structure | Body-centered cubic structure |
| Crystal plane | (0223), (0335), (0334) | (001) |
| Presence or absence of variant | Present (4 kinds) | Absent |
| Heat-resistant temperature (° C.) | >450 | 350 |
| Perpendicular magnetic anisotropy $K_U$ (erg/cm³) (for 1 nm CFA) | $3.1 \times 10^6$ | $8.0 \times 10^5$ |
| Interfacial magnetic anisotropy $K_s$ (erg/cm²) | 2.2 | 1.0 |
| TMR ratio (%) at room temperature | 132 | 91 |

In a Ru underlayer structure, high perpendicular magnetic anisotropy and a high TMR ratio are realized irrespective of the fact that the crystal structure is complicated. When the Ru underlayer structure has high heat resistance in addition to the high characteristics required from these perpendicular MTJ elements, the adverse effect of an annealing treatment during the production process for memory elements including MRAM can be suppressed. Furthermore, in a case in which the Ru underlayer structure is used as an underlayer structure in a magnetic recording medium, an annealing treatment that is necessary to increase the degree of alloy disorder and to obtain strong perpendicular magnetization can be carried out.

EXAMPLE 5

As an example of using an element other than Ru, having an hcp structure, as the underlayer, the growth of a Re underlayer will be explained. Re is a noble metal having an hcp structure similarly to Ru. The lattice constants are a=0.2761 nm and c=0.4458 nm, and in a case in which Re grows to have the (02-23) plane, the interatomic distance in a square-shaped lattice that is equivalent to FIG. 4(A) is 0.274 to 0.276 nm, and the atomic plane spacing in a diagonal direction is 0.1195 nm. Since these are larger by about 2% than that of Ru, lattice matching properties with MgO are further improved. Furthermore, since the melting point is very high such as 3186° C., growth equivalent to a Ru underlayer and a heat resistant effect are expected. Thus, a Re (30 nm)/Fe (0.7 nm)/MgO (2 nm) structure was produced on an MgO (001) substrate using a RF magnetron sputtering apparatus. The Re layer was formed at room temperature under the conditions of a RF power of 50 W and an Ar process gas pressure of 0.2 Pa, and then a post-annealing treatment in a vacuum at 300° C. was performed. The Fe and MgO layers were produced under the same conditions as those for Re, using RF sputter.

Figure 23:
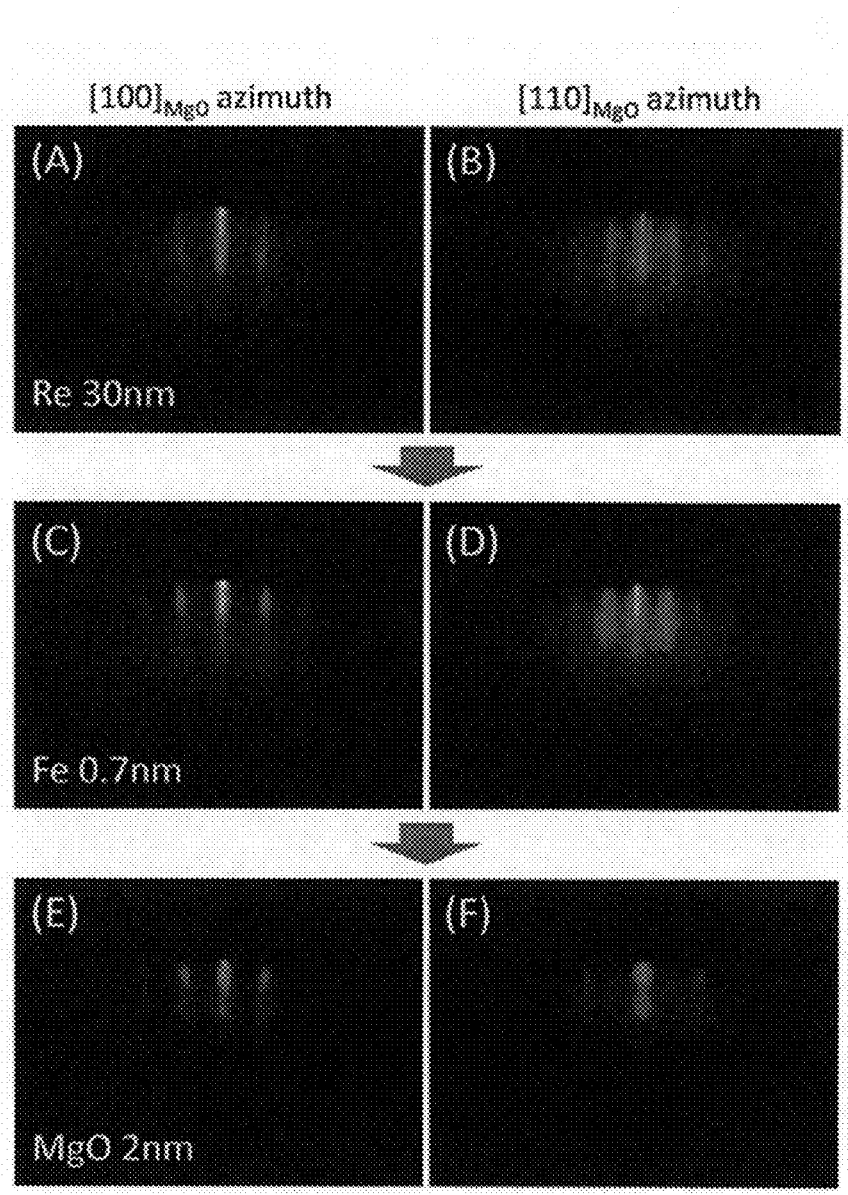
FIG. 23 shows diagrams showing reflective high speed electron beam diffraction images.

FIGS. 23(A) and 23(B) are images obtained by performing an observation of the surface immediately after the formation of a Re (30 nm) film using a reflection high-energy electron diffraction (RHEED). Streak-like images were obtained, and epitaxial growth was confirmed. Furthermore, the Re film has a 4-fold symmetry with respect to the substrate rotation, and it was also found that an image that is almost equivalent to the case of a Ru underlayer is obtained. Next, FIGS. 23(C) and 23(D) show RHEED images after the formation of a Fe (0.7 nm) film, and FIGS. 23(E) and 23(F) show RHEED images after the formation of an MgO (2 nm) film. Since the Fe layer undergoes epitaxial growth along the Re underlayer structure, and (001) growth with a bcc structure, it was confirmed that the Re underlayer also functions as an underlayer for cubic ferromagnetic materials. Also, it was confirmed that the MgO layer underwent epitaxial growth.

Figure 24:
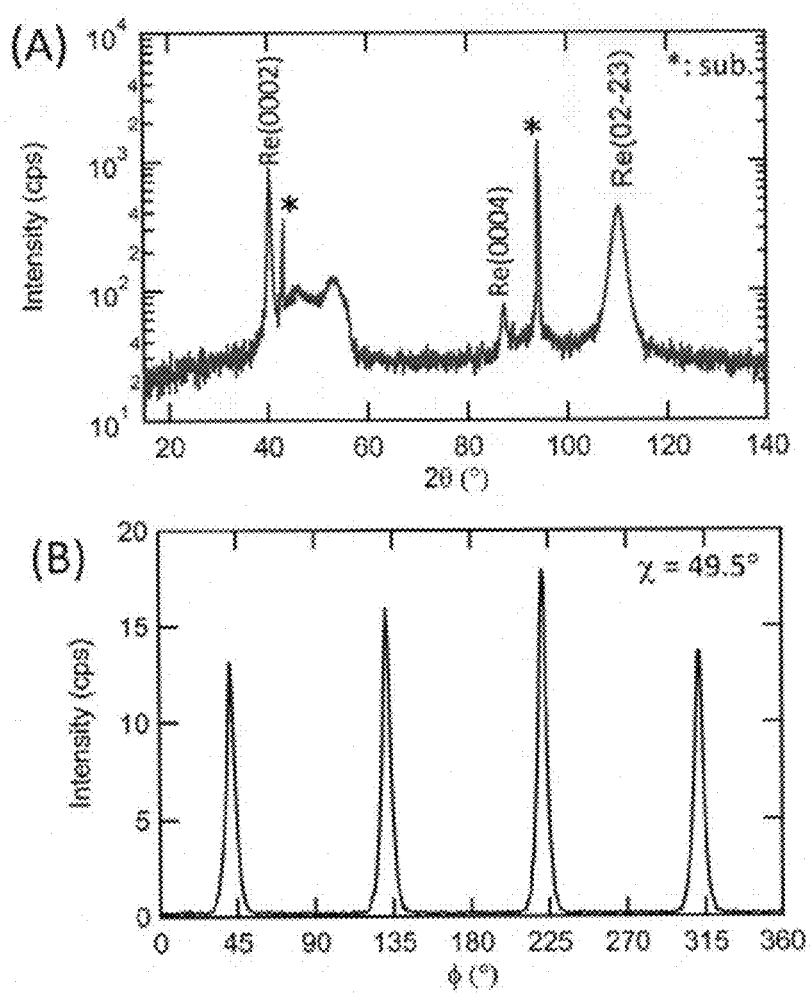
FIG. 24 shows the X-ray diffraction patterns (CuKα radiation source) of a Re underlayer structure/Fe (0.7 nm)/MgO (2 nm) laminate structure.

FIG. 24(A) shows the X-ray diffraction profile ($2\theta$-$\omega$ scan) of a multilayer film having this MgO substrate/Re (30 nm)/Fe (0.7 nm)/MgO (2 nm) structure. Clear (02-23) peaks are observed at near $2\theta$=110°. Furthermore, (0002) and (0004) peaks are observed, but their intensities are relatively weak, and (02-23) planar growth is the main component. In order to identify (02-23) orientation growth and epitaxial growth, the substrate may be inclined to the incident direction of X-radiation, and $\phi$ scanning may be performed with respect to the (0002) peaks. FIG. 24(B) shows the results of $\phi$ scanning with respect to the (0002) peaks in the case of inclining the substrate by 49.5°. From the results that 4-fold symmetric peaks are clearly obtained, and that the angle of the inclined substrate (49.5°) is close to the angle formed by the (0001) plane and the direction of the (02-23) plane (50.6°, calculated value), it can be concluded that epitaxial growth in the direction of the (02-23) plane of Re has been realized.

From the above results, it was confirmed that Re also has the (02-23) plane of a high crystal orientation index and is capable of epitaxial growth similarly to Ru, and functions as an underlayer for a cubic ferromagnetic layer.

INDUSTRIAL APPLICABILITY

The perpendicularly magnetized film according to the present invention can be utilized as a perpendicular magnetic recording medium, and is particularly suitable to be used for perpendicular magnetic recording disks that are mounted in magnetic disk apparatuses such as HDD. Furthermore, the perpendicularly magnetized film may be particularly suitably used as a discrete track medium (DTM) or a bit-patterned medium (BPM), which are promising as media for realizing ultrahigh recording densities that surpass the data recording densities of the current perpendicular magnetic recording media, or as a medium exclusively for thermally assisted magnetic recording that can achieve ultrahigh recording densities that surpass the data recording densities obtainable by a perpendicular magnetic recording system.

REFERENCE SIGNS LIST

1 UNDERLAYER STRUCTURE
2, 5, 10 SUBSTRATE
3, 6, 11 UNDERLAYER
4 PERPENDICULARLY MAGNETIZED STRUCTURE
7 PERPENDICULARLY MAGNETIZED LAYER
8, 13 NON-MAGNETIC LAYER
9 PERPENDICULAR MTJ ELEMENT
12 FIRST PERPENDICULARLY MAGNETIZED LAYER
14 SECOND PERPENDICULARLY MAGNETIZED LAYER
15 UPPER ELECTRODE

The invention claimed is:

1. A perpendicularly magnetized film structure comprising:
    any one of a cubic single crystal substrate having a (001) plane, or a substrate having a cubic oriented film grown to have a (001) plane;
    a metal underlayer formed on the substrate and formed from a metal thin film comprising a metal and having an hcp structure, in which a [0001] direction of the metal forms an angle in the range of 42° to 54° with respect to a <001>direction or the (001) plane of the substrate; and
    a perpendicularly magnetized layer located on the metal underlayer and formed from a cubic material selected from the group consisting of a Co-based Heusler alloy, a cobalt-iron (CoFe) alloy having a bcc structure, an $L1_0$-based alloy XY (X=Fe or Co, and Y=Pt or Pd), and a $DO_{22}$ type or an $L1_0$ type manganese alloy, as a constituent material, and grown in the (001) orientation.

2. The perpendicularly magnetized film structure according to claim 1, wherein the metal thin film is at least one kind of metal thin film comprising a noble metal.

3. The perpendicularly magnetized film structure according to claim 2, wherein the noble metal is selected from the group consisting of ruthenium (Ru) and rhenium (Re).

4. The perpendicularly magnetized film structure according to claim 1, further comprising a non-magnetic layer located on the perpendicularly magnetized layer.

5. The perpendicularly magnetized film structure according to claim 1, wherein the cubic material is selected from the group consisting of a Co-based Heusler alloy and a cobalt-iron (CoFe) alloy having a bcc structure.

6. A method for producing the perpendicularly magnetized film structure the method according to claim 1, comprising:

a step of providing a cubic single crystal substrate having a (001) plane;

a step of performing film formation of a metal thin film comprising a metal and having an hcp structure on the substrate;

a step of subjecting the metal thin film to a post-annealing treatment in a vacuum at 200° C. to 600° C., and thereby forming a metal underlayer; and a step of forming a perpendicularly magnetized layer formed on the metal underlayer and formed from a cubic material selected from the group consisting of a Co-based Heusler alloy, a cobalt-iron (CoFe) alloy having a bcc structure, an $L1_0$-based alloy XY (X=Fe or Co, and Y=Pt or Pd), and a $DO_{22}$ type or an $L1_0$ type manganese alloy, as a constituent material, and grown to have the (001) plane.

7. The method for producing a perpendicularly magnetized film structure according to claim 6, wherein the metal thin film is at least one kind of thin films of noble metals.

8. The method for producing a perpendicularly magnetized film structure according to claim 7, wherein the thin film of a noble metal is a thin film of ruthenium (Ru) or rhenium (Re).

* * * * *